United States Patent [19]

Barsky

[11] Patent Number: 4,667,415
[45] Date of Patent: May 26, 1987

[54] MICROLITHOGRAPHIC RETICLE POSITIONING SYSTEM
[75] Inventor: Samuel M. Barsky, Wakefield, Mass.
[73] Assignee: GCA Corporation, Andover, Mass.
[21] Appl. No.: 802,734
[22] Filed: Nov. 29, 1985
[51] Int. Cl.[4] .............................................. G01B 5/00
[52] U.S. Cl. ...................................... 33/568; 33/1 M; 269/73
[58] Field of Search ........................ 33/568, 1 M, 573; 350/531; 356/394, 244; 269/73, 254 R, 60

[56] References Cited

U.S. PATENT DOCUMENTS

| | | | |
|---|---|---|---|
| 3,069,123 | 12/1962 | Angele et al. | 33/568 |
| 4,157,818 | 6/1979 | Key | 269/73 |
| 4,492,356 | 1/1985 | Taniguchi et al. | 269/73 |
| 4,559,717 | 12/1985 | Scire et al. | 33/568 |
| 4,575,942 | 3/1986 | Moriyama | 33/568 |

FOREIGN PATENT DOCUMENTS 2067932  8/1981  United Kingdom .................. 269/73

Primary Examiner—Robert C. Watson
Attorney, Agent, or Firm—Pahl, Lorusso & Loud

[57] ABSTRACT

In the reticle positioning system disclosed herein, a unitary structure is machined to form both a frame for holding a reticle and a compound linkage permitting lateral and rotational movement of the frame within its own plane under the control of three servo motors generating controllable displacements.

5 Claims, 4 Drawing Figures

MICROLITHOGRAPHIC RETICLE POSITIONING SYSTEM

BACKGROUND OF THE INVENTION

The present invention relates to microlithographic projection systems and more particularly to a reticle mount for use in a microlithographic projection system which permits the reticle to be precisely translated and rotated in its own plane.

As is understood by those skilled in the manufacture of integrated circuits, the fabrication of such devices requires the forming, on the surface of a semiconductor wafer, of a succession of complex images which must be overlaid one on top of the other in precise registration. Thus, in the microlithographic projection systems which are employed for forming these images, some mechanism must be provided for precisely positioning the reticle with respect to the wafer or vice versa. In most microlithographic projection systems manufactured and sold heretofore, the reticle is typically aligned mechanically on its mount at the object plane of the optical column and fine adjustment is provided by translating or rotating the wafer to effect precise registration, registration being sensed by optical systems which align fiducial marks on the wafer with corresponding marks on the reticle or the frame holding the reticle. As will be understood, however, it is relative motion between the reticle and the wafer which is significant and either element may be moved to effect alignment.

Among the several objects of the present invention may be noted the provision of a novel mount for a microlithographic reticle permitting precise lateral and rotational movement of the reticle within its own plane; the provision of such a mount which permits such movement without hysteresis; the provision of such a mount which strongly resists movements other than in the plane of the reticle; the provision of such a mount which facilitates precise positioning; the provision of such a mount which is highly reliable and which is of relatively simple and inexpensive construction. Other objects and features will in part be apparent and in part pointed out hereinafter.

SUMMARY OF THE INVENTION

Briefly, the present invention involves a flexure mount for a planar microlithographic reticle which permits lateral and rotational movement of a reticle within its own plane while resisting other movements. A rigid rectangular frame is provided for holding a reticle and a stationary mounting member is provided adjacent a central portion of each of one pair of opposite sides of the frame. The mount includes, along each of the other pair of opposite sides of the frame, a pair of links which extend in opposite directions parallel to the respective side of the frame from a flexible point of attachment to the frame to a flexure joint adjacent a corner of the frame. Along each of the first pair of opposite sides of the frame a pair of links are provided which extend in opposite directions, parallel to the respective side, from the respective mounting member to the flexure joint at the respective corner.

Preferably, movement of the reticle-carrying frame is controlled by three motor means each capable of generating a controllable displacement. Respective connecting rod elements join each of a pair of the motor means to a corresponding pair of points on one side of the frame, the points being substantially displaced from one another. A third connecting rod element joins the third motor means to a central point on an adjacent side of the frame.

BRIEF DESCRIPTION OF THE DRAWINGS

Corresponding reference numbers indicate corresponding parts throughout the several views of the drawings.

DESCRIPTION OF THE PREFERRED EMBODIMENT

Figure 1:
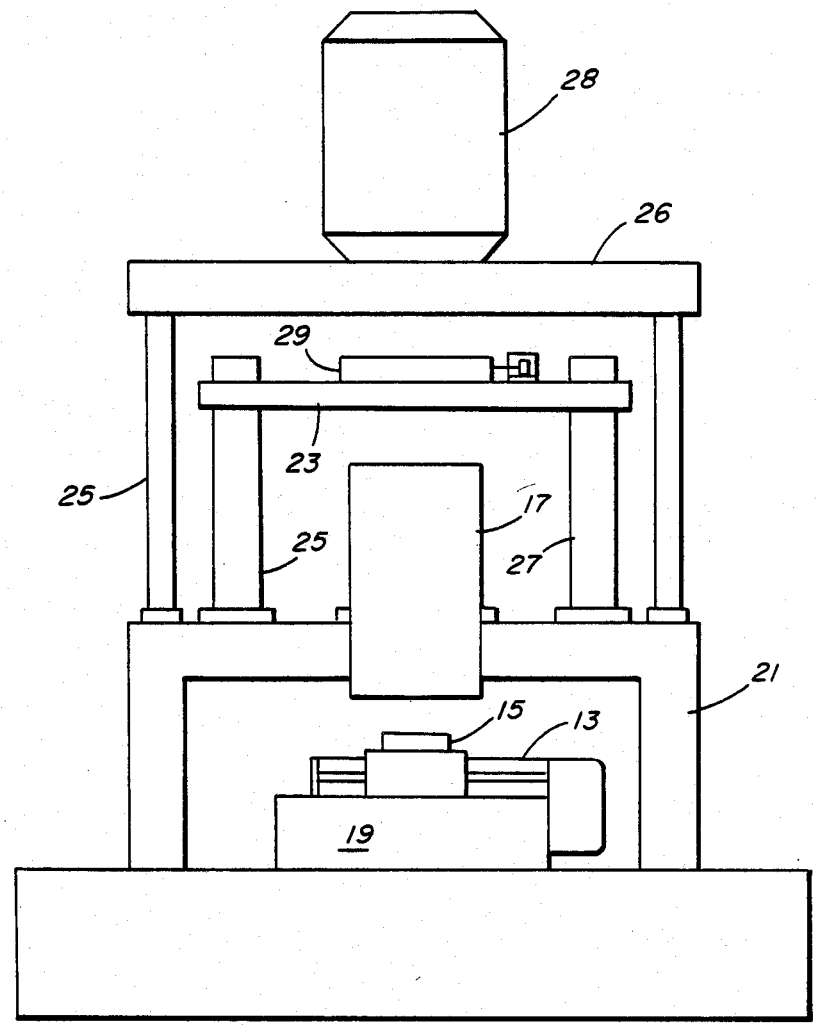
FIG. 1 is a diagrammatic illustration of microlithographic printing apparatus employing a reticle mount constructed in accordance with the present invention.

Referring now to FIG. 1, the microlithographic printing apparatus illustrated there is of the step and repeat variety employing an X-Y stage 13 for precisely moving and positioning a wafer-holding chuck 15 under an optical projection column which includes a precision reduction lens 17. The X-Y stage 13 is positioned with respect to a base plate 19 by suitable motors on each axis, e.g. linear stepper motors, and the lens 17 is supported above the base plate by a suitably rigid framework, indicated generally by reference character 21.

A triangular base 23 for the reticle mount is supported above the framework 21 by means of posts 25-27. Preferably, posts 25-27 incorporate motor and lead screw assemblies for adjusting the height of the respective corners of base 23 so as to facilitate focus and magnification adjustments between the reticle and a wafer held in chuck 15. In accordance with the practice of the present invention, the base 23 carries a reticle mount or plate assembly, designated generally by reference character 29, which permits precise lateral and rotational movement of a reticle within its own plane while resisting other movements. Mounted above the reticle holder, i.e. on a separately supported base plate 26, is a suitable light source 28 for illuminating a reticle held in mount 29.

Figure 2:
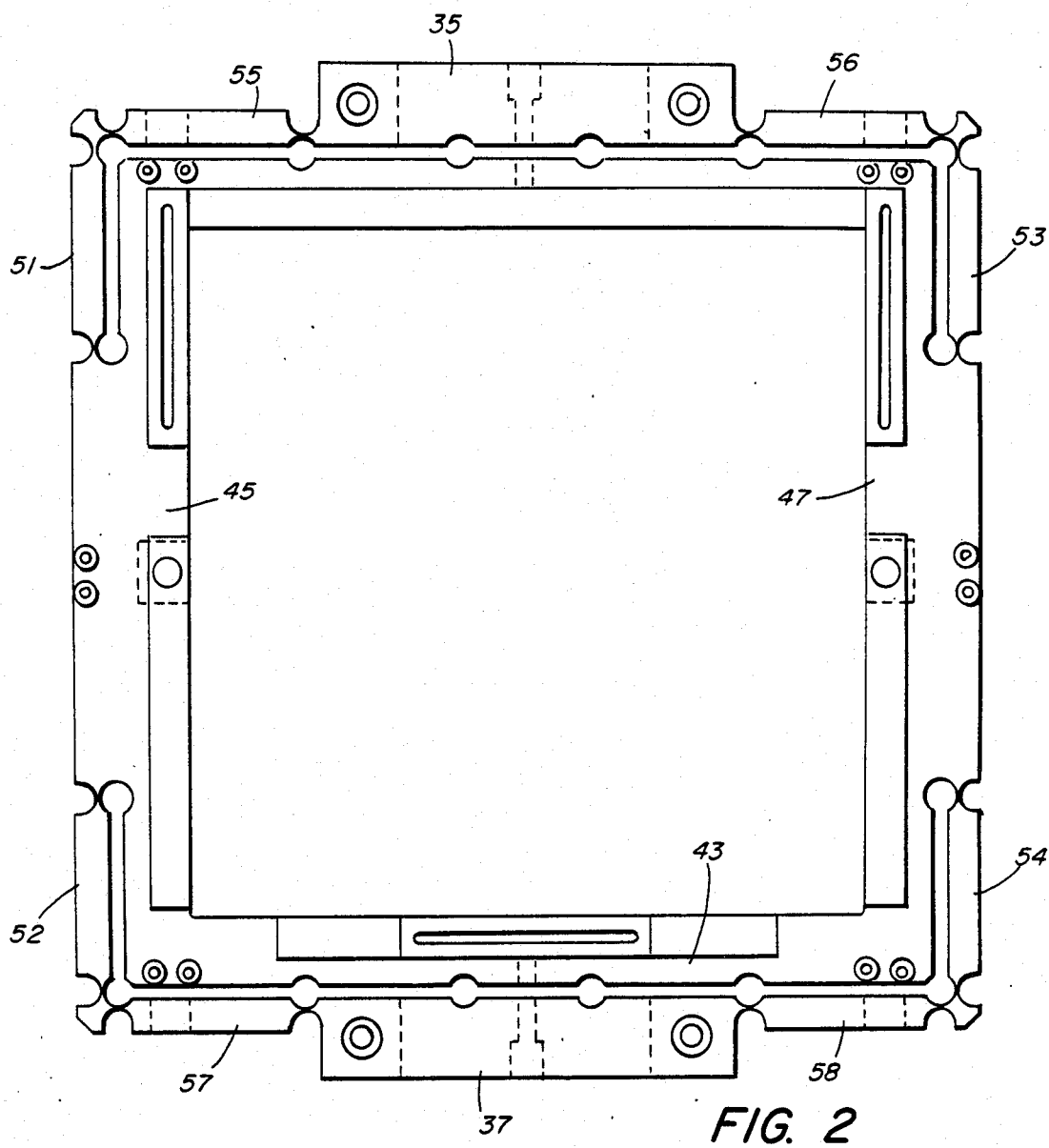
FIG. 2 is a perspective view of a reticle mount constructed in accordance with the present invention together with actuators for precisely controlling the position of a reticle held in the mount.
Figure 3:
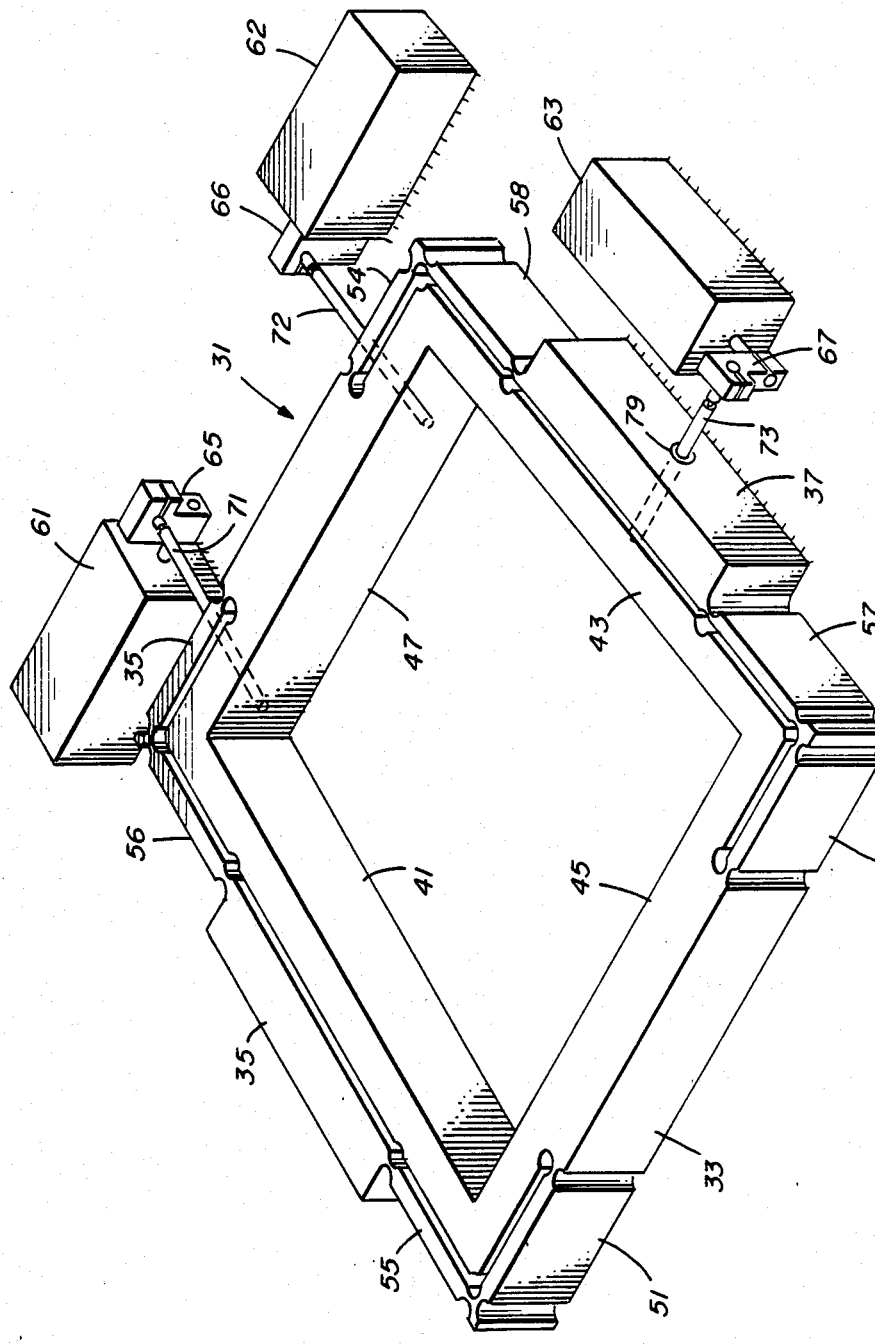
FIG. 3 is a plan view in greater detail of a flexure mount constructed in accordance with the present invention.

Referring now to FIGS. 2 and 3, it can be seen that the reticle mount 29 comprises a unitary flexure assembly 31 which provides both an inner rectangular frame 33 for receiving a reticle and a compound trapezoidal linkage which permits movement of the frame relative to a pair of mounting blocks 35 and 37. Preferably, the reticle mount assembly 31 is machined from a unitary block of metal, e.g. aluminum.

While the orientation and function of the various links formed in the assembly 31 are described in greater detail hereinafter, it is useful to note at the outset that the movable frame 33 and the mounting blocks 35 are separated by slots milled in the block and that flexure joints defining the ends of the various links are formed by milling circular holes through the block to provide narrowed regions which are of increased compliance relative to the thicker links. As is understood by those skilled in the art, the movements required for achieving final alignment in a microlithographic system are quite small, e.g. a few millimeters and thus only small clearances between the moving and stationary parts of the mounting assembly 31 are required and the flexure joints are not subjected to any great distortions.

Referring more particularly to FIG. 3, it can be seen that the mounting blocks 35 and 37 are located adjacent the central portion of each of one pair of opposite sides of the frame 33, this pair of opposite sides being designated by reference characters 41 and 43 respectively. The other pair of sides of the frame are designated by reference characters 45 and 47. Along each of these "other" sides 45 and 47 and generally parallel thereto are a pair of links which extend in opposite directions from a flexible point of attachment to the respective side of the frame to a flexure joint adjacent the corner of the frame. With reference to the side 45, these links are designated by reference characters 51 and 52 while the links extending parallel to the side 47 are designated by reference characters 53 and 54.

Along each of the sides 41 and 43 are a respective pair of links which extend in opposite directions parallel to the respective side, from the adjacent mounting block or member 35 and 37. With respect to the side 41, these links are designated by reference characters 55 and 56 and, with reference to the side 43, these links are designated by reference characters 57 and 58. The links 55-58 are joined, by the flexures at the corners of the assembly, to the links 51-54 respectively.

As indicated previously, the mounting blocks 35 and 37 are stationary or fixed relative to the base 23 while the frame 33 is movable over small dimensions with respect to the mounting blocks owing to the compliance provided by the compound linkage described above.

Figure 4:
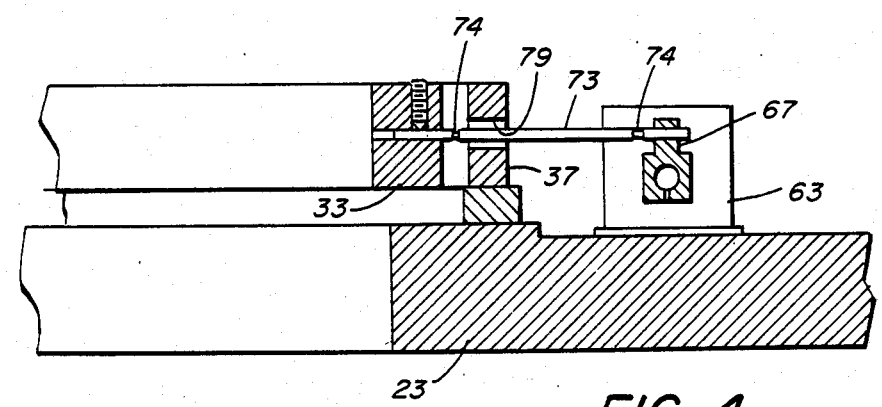
FIG. 4 is a sectional view showing the coupling of a drive motor to the mount.

Movement of the frame 33 is controlled by three torque motors or galvanometers 61-63. Galvanometers 61-63 may, for example, be of the type manufactured and sold by General Scanning, Inc. Mounted on the output shaft of each galvanometer 61-63 is a respective crank 65-67 and, from each crank, a connecting rod element 71-73 extends to the frame 33 for imparting to the corresponding point on the frame a linear motion or displacement generated by the respective galvanometer motor. The connecting rod elements 71-73 are essentially solid rods of a suitable metal, e.g. stainless steel, which are ground to provide, adjacent each end, a necked down flexure portion, designated by reference character 74. It can thus be seen that these elements provide a connecting rod function in that they will transmit thrust or tension but will be relatively compliant to any motion of the frame 33 transverse to the axis of the rod. This construction is shown in greater detail in the enlarged view of FIG. 4.

The distal ends of the connecting rod elements 71 and 72 are connected to spaced apart points on the side 47 of the frame 33, passing freely through corresponding apertures in the links 53 and 54. The distal end of the connecting rod 73 is connected 53 and 54. The distal end of the connecting rod 73 is connected to a central point on the side 43 of the frame 33, passing freely through an aperture 79 in the mounting block 37.

As will be understood, a displacement generated by the galvanometer motor 63 will produce translational movement of a corresponding point on the frame 33, i.e. in a direction generally parallel to the axis of the connecting rod 73 and parallel also to the links 51-54. This direction is conveniently designated the X-axis. Movement in this direction is accommodated by the compliance provided by the links 55-58 and the transverse compliance of the connecting rods 71-72.

Similarly, joint actuation of the motors 61 and 62, i.e., actuations producing movements in the same direction, will produce an essentially pure translation of the reticle-carrying frame 33 in a direction transverse to the X-axis. This direction is conveniently designated the Y-axis. This movement along the Y-axis is accommodated by deflection of the links 51-54 and the transverse compliance of the connecting rod 73.

On the other hand, if the galvanometer motors 61 and 62 are energized to produce movement in opposite directions, it can be seen that a rotation of the frame 33 will be effected. This rotation is accommodated by deflection of all the links and by the compliance provided by the necked down portions of each of the connecting rod elements 71-73.

In that the integral reticle flexure mount 31 provides for the several desired motions without requiring any sliding fits, it can be seen that the system greatly facilitates precise positioning since there is virtually no friction or hysteresis involved. Thus, a linear servo system operating from conventional optical sensors to appropriately energize the galvanometer motors 61-63 can provide the precise positioning and orientation of a microlithographic reticle to obtain registration and alignment with a very high degree of precision.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. A flexure mount for a planar microlithographic reticle permitting lateral and rotational movement of the reticle within its own plane while resisting other movements, said mount comprising:
   a rigid rectangular frame for holding a reticle;
   adjacent a central portion of each of one pair of opposite sides of said frame, a respective stationary mounting member;
   along each of the other pair of opposite sides of said frame, a pair of links which extend in opposite directions parallel to the respective side from a flexible point of attachment to the respective side to a flexure joint adjacent a corner of the frame;
   along each of the said one pair of opposite sides of said frame, a pair of links which extend in opposite directions parallel to the respective side from the respective mounting member to the said flexure joint adjacent the respective corner of the frame;
   three motor means for generating controllable displacements;
   one pair of said motor means being connected to a pair of points on one side of said other pair of opposite sides, said points being substantially displaced from one another along said side; and
   a third motor means being connected to a central point on a side of said one pair of sides adjacent said one side of said other pair of opposite sides.

2. A mount as set forth in claim 1 wherein said frame, said links and said flexure joints are formed by machining an integral metal part.

3. A mount as set forth in claim 2 wherein said links are formed by cutting clearance slots between each link and the adjacent portion of the corresponding side of said frame and said flexure joints are formed by cutting away material to leave thin flexible regions adjacent each end of each link.

4. A flexure mount for a planar microlithographic reticle permitting lateral and rotational movement of the reticle within its own plane while resisting other movements, said mount comprising;

a rigid rectangular frame for holding a reticle;

adjacent a central portion of each of one pair of opposite sides of said frame, a respective stationary mounting member;

along each of the other pair of opposite sides of said frame, a pair of links which extend in opposite directions parallel to the respective side from a flexible point of attachment to the respective side to a flexure joint adjacent a corner of the frame;

along each of the said one pair of opposite sides of said frame, a pair of links which extend in opposite directions parallel to the respective side from the respective mounting member to the said flexure joint adjacent the respective corner of the frame;

three motor means for generating controllable displacements;

a pair of connecting rod means joining each of a pair of said motor means to a pair of points on one side of said other pair of opposite sides, said points being substantially displaced from one another along said side; and a third connecting rod means joining the third said motor means to a central point on a side of said one pair of opposite sides adjacent said one side of said other pair of opposite sides.

5. A mount as set forth in claim 4 wherein said motor means are galvanometer motors provided with crank arms to which said connecting rod means are connected at their ends opposite said frame.

* * * * *